United States Patent
Kim et al.

(10) Patent No.: US 7,821,110 B2
(45) Date of Patent: Oct. 26, 2010

(54) CIRCUIT STRUCTURES AND METHODS WITH BEOL LAYER(S) CONFIGURED TO BLOCK ELECTROMAGNETIC INTERFERENCE

(75) Inventors: Dae Ik Kim, Fishkill, NY (US); Jonghae Kim, Fishkill, NY (US); Moon Ju Kim, Wappingers Falls, NY (US); Choongyeun Cho, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 11/747,342

(22) Filed: May 11, 2007

(65) Prior Publication Data

US 2008/0277773 A1    Nov. 13, 2008

(51) Int. Cl.
  *H01L 23/552*    (2006.01)
(52) U.S. Cl. .................. 257/659; 257/297; 257/422
(58) Field of Classification Search .............. 257/659, 257/422, 297
  See application file for complete search history.

(56) References Cited

U.S. PATENT DOCUMENTS

| | | |
|---|---|---|
| 5,659,245 A | 8/1997 | Ping et al. |
| 6,063,234 A | 5/2000 | Chen et al. |
| 6,190,936 B1 | 2/2001 | Moore et al. |
| 6,300,241 B1 | 10/2001 | Moore et al. |
| 6,309,956 B1 | 10/2001 | Chiang et al. |
| 6,319,818 B1 | 11/2001 | Stamper |
| 6,455,770 B2 | 9/2002 | Pulver |
| 6,677,248 B2 | 1/2004 | Kwon et al. |
| 6,720,245 B2 | 4/2004 | Stucchi et al. |
| 6,725,092 B2 | 4/2004 | MacDonald et al. |
| 6,865,084 B2 | 3/2005 | Lin et al. |
| 6,888,063 B1 * | 5/2005 | Lien et al. .................. 174/394 |
| 6,972,209 B2 | 12/2005 | Agarwala et al. |
| 7,013,558 B2 | 3/2006 | Bachman |
| 7,047,074 B2 | 5/2006 | Connelly et al. |
| 7,067,902 B2 | 6/2006 | Hichri et al. |
| 7,091,412 B2 | 8/2006 | Wang et al. |
| 7,135,643 B2 | 11/2006 | vanHaaster et al. |
| 7,145,084 B1 | 12/2006 | Sarihan et al. |

(Continued)

FOREIGN PATENT DOCUMENTS

WO    WO/2006/011456    *    7/2005

*Primary Examiner*—Thao X Le
*Assistant Examiner*—Geoffrey Ida
(74) *Attorney, Agent, or Firm*—William E. Schiesser; Kevin P. Radigan, Esq.; Heslin Rothenberg Farley & Mesiti P.C.

(57) ABSTRACT

Back end of line (BEOL) circuit structures and methods are provided for blocking externally-originating or internally-originating electromagnetic interference. One such BEOL circuit structure includes one or more semiconductor substrates supporting one or more integrated circuits, and one or more BEOL layers disposed over the semiconductor substrate(s). At least one BEOL layer includes a conductive pattern defined at least partially by a plurality of elements arrayed in a first direction and a second direction throughout at least a portion thereof. The plurality of elements are sized and positioned in at least one of the first and second directions to block electromagnetic interference of a particular wavelength from passing therethrough. In one implementation, a first conductive pattern of a first BEOL layer polarizes electromagnetic interference, and a second conductive pattern of a second BEOL layer blocks the polarized electromagnetic interference.

12 Claims, 8 Drawing Sheets

U.S. PATENT DOCUMENTS

| | | | |
|---|---|---|---|
| 7,250,363 B2 * | 7/2007 | Landis et al. | 438/622 |
| 2002/0096736 A1 * | 7/2002 | Brennan et al. | 257/531 |
| 2004/0074655 A1 * | 4/2004 | Takahashi et al. | 174/35 MS |
| 2004/0230271 A1 | 11/2004 | Wang et al. | |
| 2005/0034885 A1 | 2/2005 | Groves et al. | |
| 2006/0159958 A1 | 7/2006 | Lee | |
| 2006/0241236 A1 | 10/2006 | Kuznetsov et al. | |
| 2007/0257337 A1 * | 11/2007 | Yanase et al. | 257/659 |
| 2008/0084681 A1 * | 4/2008 | Naito et al. | 361/818 |

* cited by examiner

CIRCUIT STRUCTURES AND METHODS WITH BEOL LAYER(S) CONFIGURED TO BLOCK ELECTROMAGNETIC INTERFERENCE

TECHNICAL FIELD

The present invention relates in general to integrated circuits and methods of fabrication, and more particularly, to back end of line (BEOL) structures and methods for shielding integrated circuits from externally or internally generated electromagnetic interference.

BACKGROUND OF THE INVENTION

As used herein, electromagnetic interference (EMI) refers generally to both electromagnetic interference emissions and radio frequency interference (RFI) emissions. The term "electromagnetic" should be considered to refer generally to electromagnetic and radio frequency.

During normal operation, electronic devices may generate undesirable electromagnetic energy that can interfere with the operation of adjacent electronic devices due to EMI transmission by radiation and conduction. Electromagnetic energy can be of a wide range of wavelengths and frequencies. To minimize problems associated with EMI, sources of undesirable electromagnetic energy may be shielded and electrically grounded using a housing or other enclosure. Alternatively, or additionally, susceptors of EMI may be similarly shielded and electrically grounded employing a housing. Shielding is designed to prevent both ingress and egress of electromagnetic energy relative to the housing or other enclosure in which the electronic device is disposed.

Shields are generally constructed to reduce EMI to a particular wavelength, or range of wavelengths. EMI shields are typically constructed of a conductive material operating to reflect the radiation component of EMI and to drain to electrical ground the conducted component of EMI. For example, EMI shields are typically constructed of a metal, such as copper, aluminum, gold, tin, steel and nickel. Conventionally, EMI shielding occurs at a package level wherein a conductive enclosure is placed around an electronic device, such as an electronic module. Shielding at this level may be both expensive and time consuming.

EMI protection is particularly important in small, densely packaged, sensitive electronic applications operating at high frequencies. EMI shielding for such applications is typically a separate housing structure, and a separate fabrication process from the fabrication process of the electronic device to be protected.

SUMMARY OF THE INVENTION

Accordingly, provided herein, in one aspect, is a circuit structure configured with integrated electromagnetic interference shielding using conventional integrated circuit fabrication processes. In one embodiment, the circuit structure includes at least one substrate, comprising at least one integrated circuit, and at least one back end of line (BEOL) layer disposed over the at least one substrate. The at least one BEOL layer includes a conductive pattern defined at least partially by a plurality of elements arrayed in a first direction and a second direction throughout at least a portion thereof. The plurality of elements of the conductive pattern are sized and positioned in at least one of the first direction or the second direction to block electromagnetic interference of a particular wavelength or a range of wavelengths from passing therethrough.

In another embodiment, a circuit structure is provided which includes at least one semiconductor substrate, having at least one integrated circuit, and a plurality of back end of line (BEOL) layers disposed over the at least one semiconductor substrate. The plurality of BEOL layers include a plurality of BEOL dielectric layers interleaved with a plurality of BEOL interconnect metallization layers for electrically connecting to the at least one integrated circuit. At least one BEOL layer of the plurality of BEOL layers includes a conductive pattern defined at least partially by a plurality of elements arrayed in a first direction and a second direction throughout at least a portion thereof. The plurality of elements of the conductive pattern of the at least one BEOL layer are sized and positioned in at least one of the first direction or the second direction to block electromagnetic interference of particular wavelength from passing therethrough.

In a further aspect, a method of fabricating a circuit structure is provided which includes: providing at least one semiconductor substrate comprising at least one integrated circuit; and forming a plurality of back end of line (BEOL) layers over the at least one semiconductor substrate, wherein the plurality of BEOL layers includes at least one BEOL dielectric layer and at least one BEOL interconnect metallization layer, and wherein the forming of the plurality of BEOL layers further includes: designing a conductive pattern for at least one BEOL layer of the plurality of BEOL layers; and providing the at least one BEOL layer with the conductive pattern by defining a plurality of elements arrayed in a first direction and a second direction throughout at least a portion thereof, wherein the plurality of elements of the conductive pattern are sized and positioned in at least one of the first direction or the second direction to block the electromagnetic interference of particular wavelength from passing therethrough.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As noted, presented herein are circuit structures and methods for blocking electromagnetic interference, for example, from ingressing to or egressing from an integrated circuit employing back end of line structures. As used herein, "blocking" refers to shielding, stopping, suppressing, or otherwise preventing an electromagnetic interference (EMI) wave from propagating therethrough. Both external electromagnetic interference and internal electromagnetic interference are discussed below. As one example, the circuit structure comprises an integrated circuit formed, for example, on or within a semiconductor substrate during front end of line (FEOL) processing and having a plurality of interleaved interconnect metallization and dielectric layers formed during back end of line (BEOL) processing above the integrated circuit.

Figure 1:
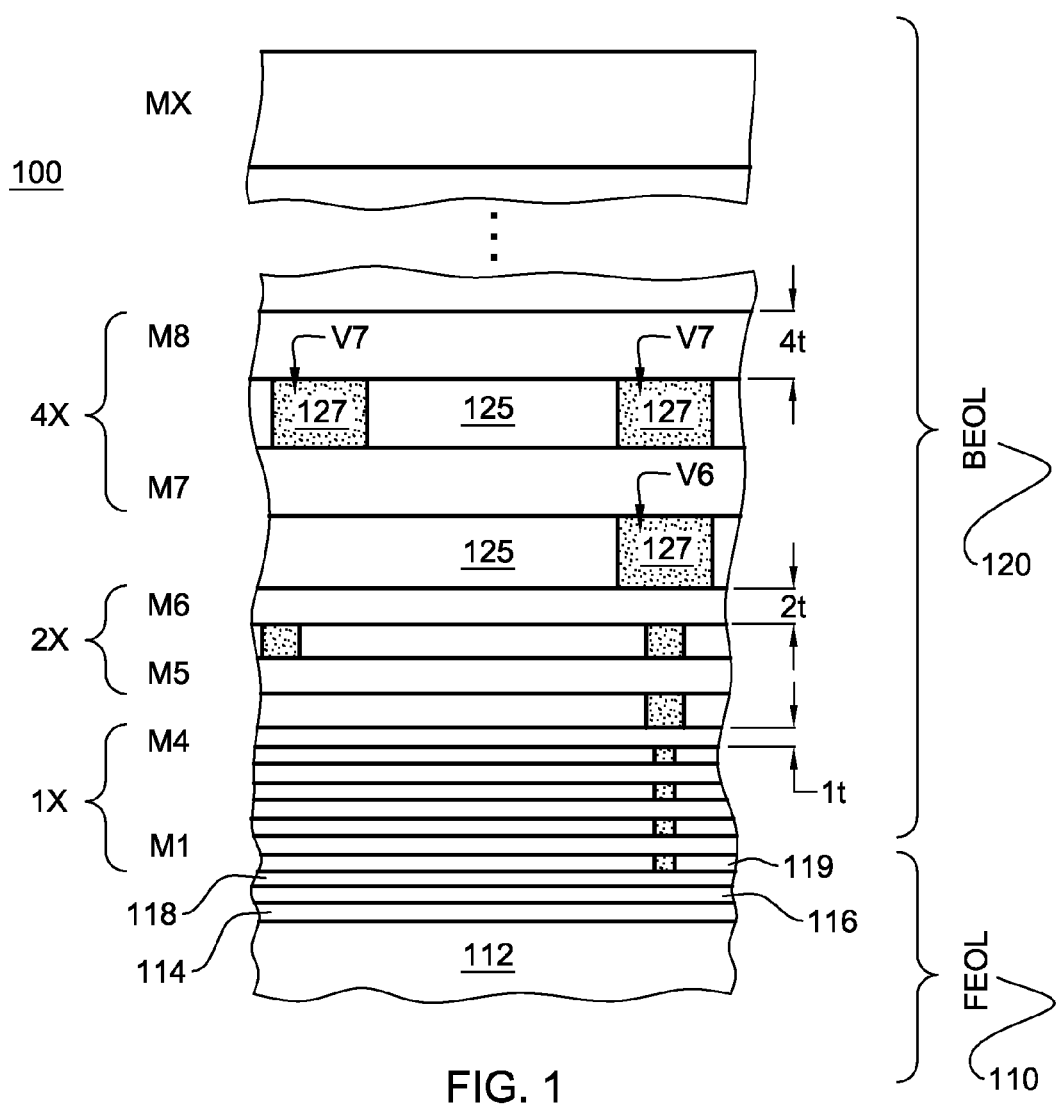
FIG. 1 is a cross-sectional elevational view of one embodiment of a circuit structure to employ electromagnetic interference shielding, in accordance with an aspect of the present invention.

FIG. 1 depicts one example of a circuit structure to employ electromagnetic interference shielding, in accordance with an aspect of the present invention. This circuit structure, generally denoted 100, includes FEOL layers/structures 110 and BEOL layers/structures 120. By way of example, FIG. 1 depicts a cross-sectional elevational view of one embodiment of a portion of a silicon wafer having multiple integrated circuit chips defined therein. In the depicted example, FEOL layers/structures 110 include a semiconductor substrate 112, a buried oxide layer 114, a silicon layer 116, and a polysilicon layer 118. As understood in the art, integrated circuits may reside within semiconductor substrate 112, as well as (or alternatively) within silicon layer 116 and polysilicon layer 118. A dielectric layer 119 functions as a contact layer to the integrated circuit layers and completes the FEOL layers/structures 110.

Disposed above FEOL layers/structures 110 are the plurality of BEOL layers/structures 120, which conventionally include a plurality of interleaved BEOL dielectric layers and interconnect metallization layers. In this example, the BEOL interconnect metallization layers are labeled M1 . . . MX, with the layer between adjacent interconnect metallization layers being a BEOL dielectric layer.

As shown in FIG. 1, the upper BEOL interconnect metallization layers become progressively thicker, with (for example) interconnect metallization layers M5, M6 being 2× the thickness of interconnect metallization layers M1 . . . M4, interconnect metallization layers M7, M8 being 4× the thickness of interconnect metallization layers M1 . . . M4, and an upper most interconnect metallization layer MX being 8× the thickness of metallization layers M1 . . . M4. As noted, disposed between the BEOL interconnect metallization layers are the plurality of BEOL dielectric layers 125. BEOL dielectric layers 125 also become progressively thicker to mirror the thicknesses of the respective interconnect metallization layers. As shown, metallized vias 127 extend between adjacent interconnect metallization layers to, for example, facilitate electrical connection to the underlying integrated circuit(s). By way of example, metallized vias V7 electrically interconnect metal layers M7 & M8, and metallized vias V6 electrically interconnect metal layers M6 & M7, etc.

As explained further below, presented herein are various design modifications to one or more of the BEOL layers which provide for electromagnetic interference shielding within the constraints of conventionally accepted fabrication techniques.

Figure 2:
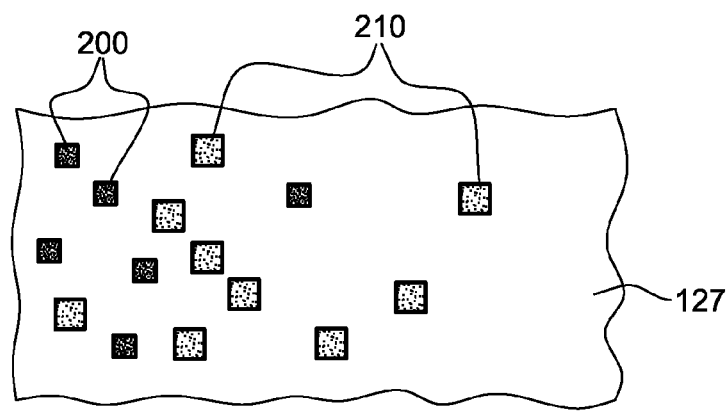
FIG. 2 is a cross-sectional plan view of one embodiment of a conventional BEOL dielectric layer of a circuit structure, such as depicted in FIG. 1.

FIG. 2 is a plan view of one embodiment of a conventional BEOL dielectric layer 127. As shown, this dielectric layer includes a plurality of metallized vias 200 and a plurality of metal fill blocks 210 that are arbitrarily added to the BEOL dielectric layer to satisfy a chemical-mechanical polishing (CMP) ratio. The chemical-mechanical polishing ratio is an area-occupation ratio between the dielectric material, such as silicon dioxide, and the metal vias and metal fill blocks. By way of example, BEOL CMP patterning is discussed in U.S. Pat. Nos. 7,067,902; 6,972,209; 6,319,818; and 6,309,956. To improve mechanical yield of the dielectric layer, and dependent upon the number of metallized vias 200, metal fill blocks 210 are added to facilitate chemical-mechanical polishing and manufacturability.

Although not shown, an interconnect metallization layer (such as M1 . . . MX in FIG. 1) may be provided with a plurality of dielectric filled openings through the metal layer to, again, facilitate CMP and manufacturability. Current semiconductor BEOL algorithms for arbitrarily placing metal fill blocks and/or dielectric filled holes in a BEOL layer allow both externally and internally generated electromagnetic interference to reach noise-sensitive circuits. This is in part because the typical fill/hole algorithms used in BEOL processing are directed to facilitating chemical-mechanical polishing only, and do not consider the electromagnetic interference phenomenon.

Figure 3:
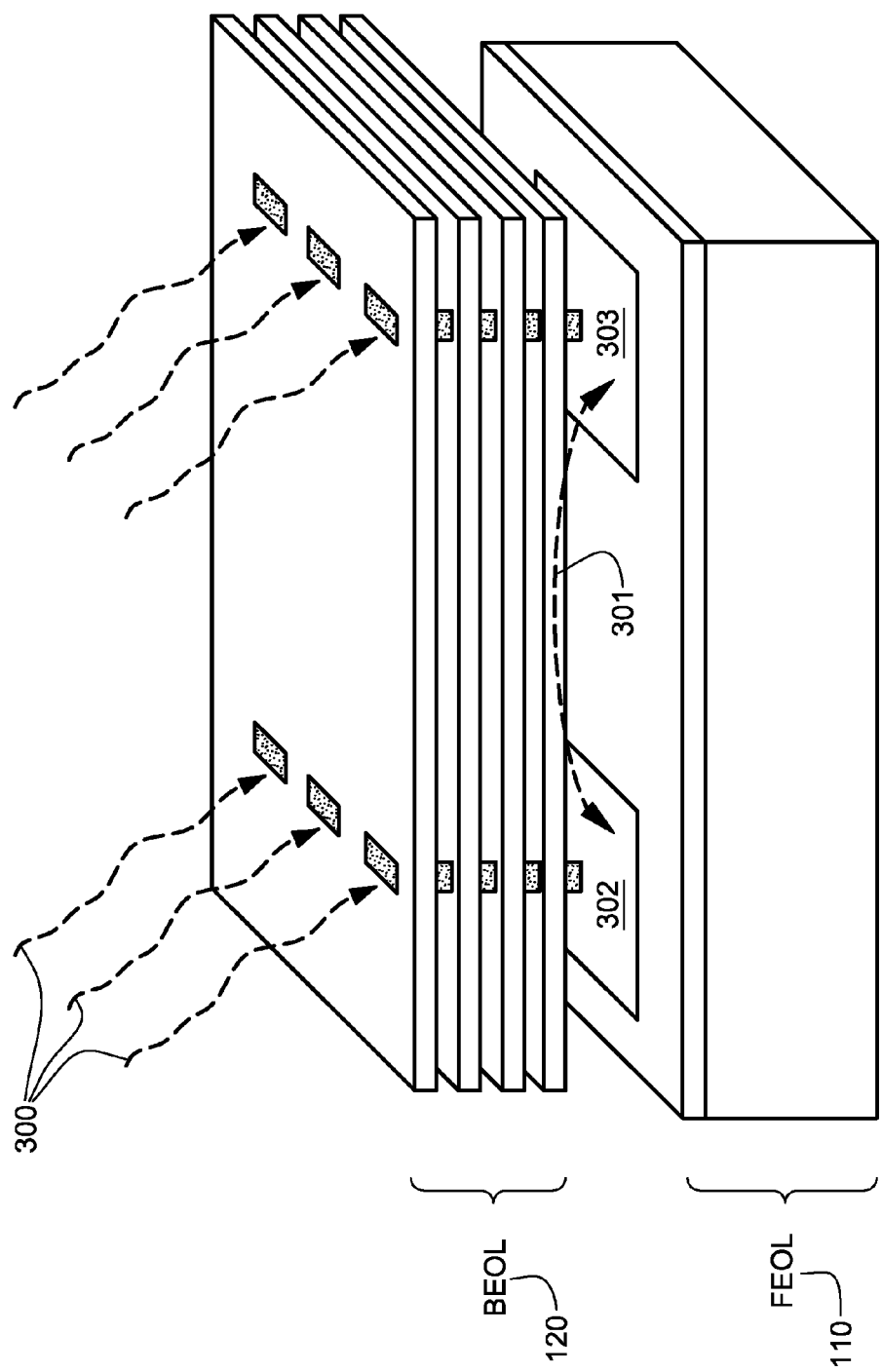
FIG. 3 is a partial isometric view of one embodiment of a conventional circuit structure showing external EMI impinging on the BEOL layers and internal EMI propagating between circuits portions of the circuit structure.

FIG. 3 depicts a simplified isometric view of the circuit structure of FIG. 1, wherein external electromagnetic interference (EMI) 300 is shown impinging upon the BEOL structures 120 and internally generated electromagnetic interference 301 is shown propagating between circuit portions 302, 303 of FEOL structures 110. The internal EMI 301 between circuit portions 302, 303 could represent electromagnetic interference emissions from a portion of a same circuit effecting a different portion of the circuit, or between, for example, different integrated circuit chips of a multichip module having shared BEOL structures 120.

Figure 4:
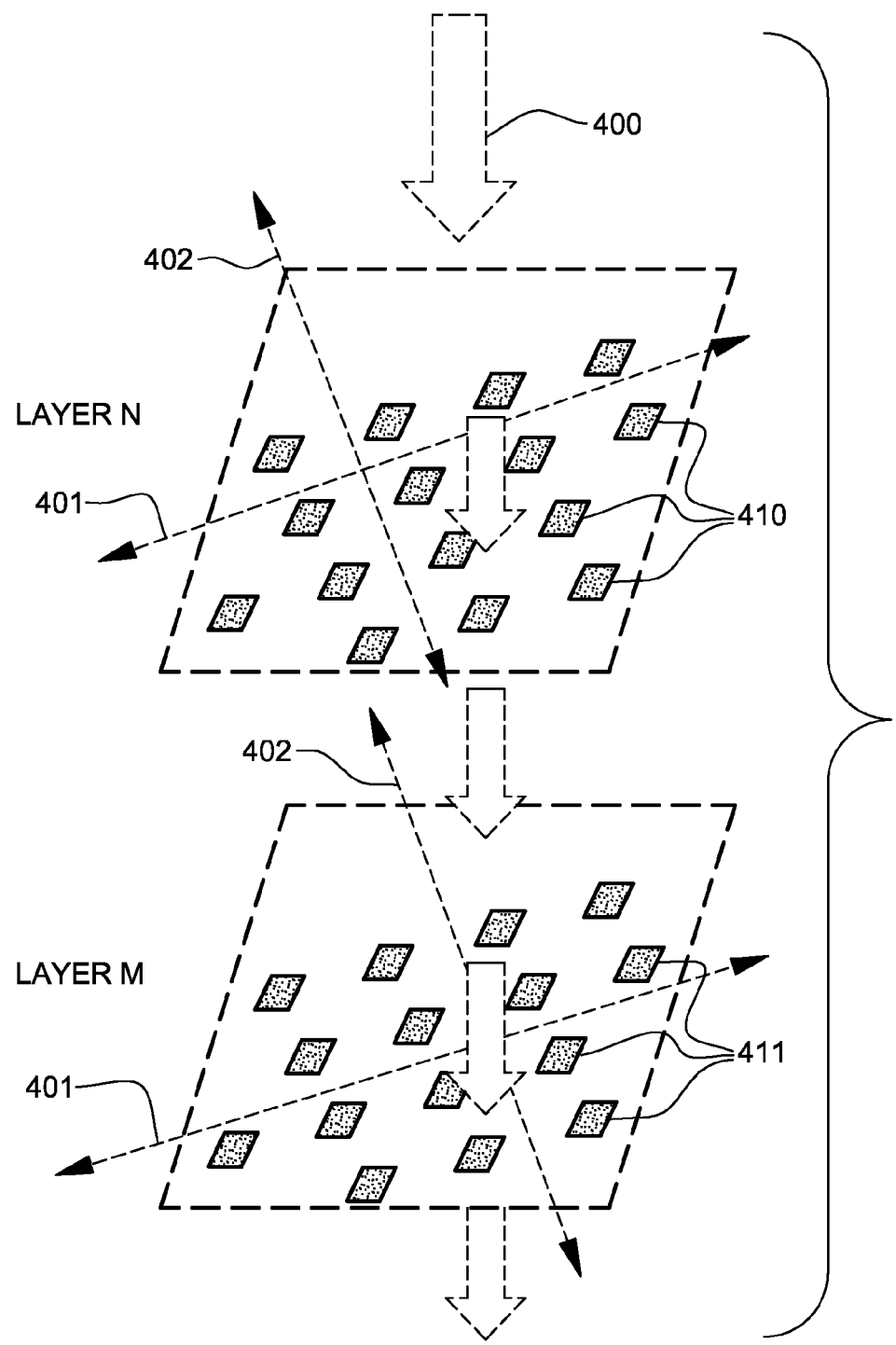
FIG. 4 is a representation of portions of two BEOL layers of a circuit structure, such as depicted in FIG. 3, wherein conventional chemical-mechanical polishing fill structures of different BEOL layers are shown allowing electromagnetic interference to pass therethrough in a first direction and a second direction.

FIG. 4 illustrates the problem with current metal via and CMP fill patterning. With EMI wave incidence into a BEOL dielectric layer, the EMI wave 400 can propagate wherever there is a non-conductive opening greater than its wavelength. In FIG. 4, layers N & M are shown to have similar CMP fill patterns 410, 411 arrayed in a first direction 401 and a second direction 402. As shown, the typical metal fill block configuration and spacing illustrated allows an EMI wave of any wavelength to pass therethrough in either the first or second direction, thus potentially interfering with the active circuitry below the BEOL layers.

Figure 5:
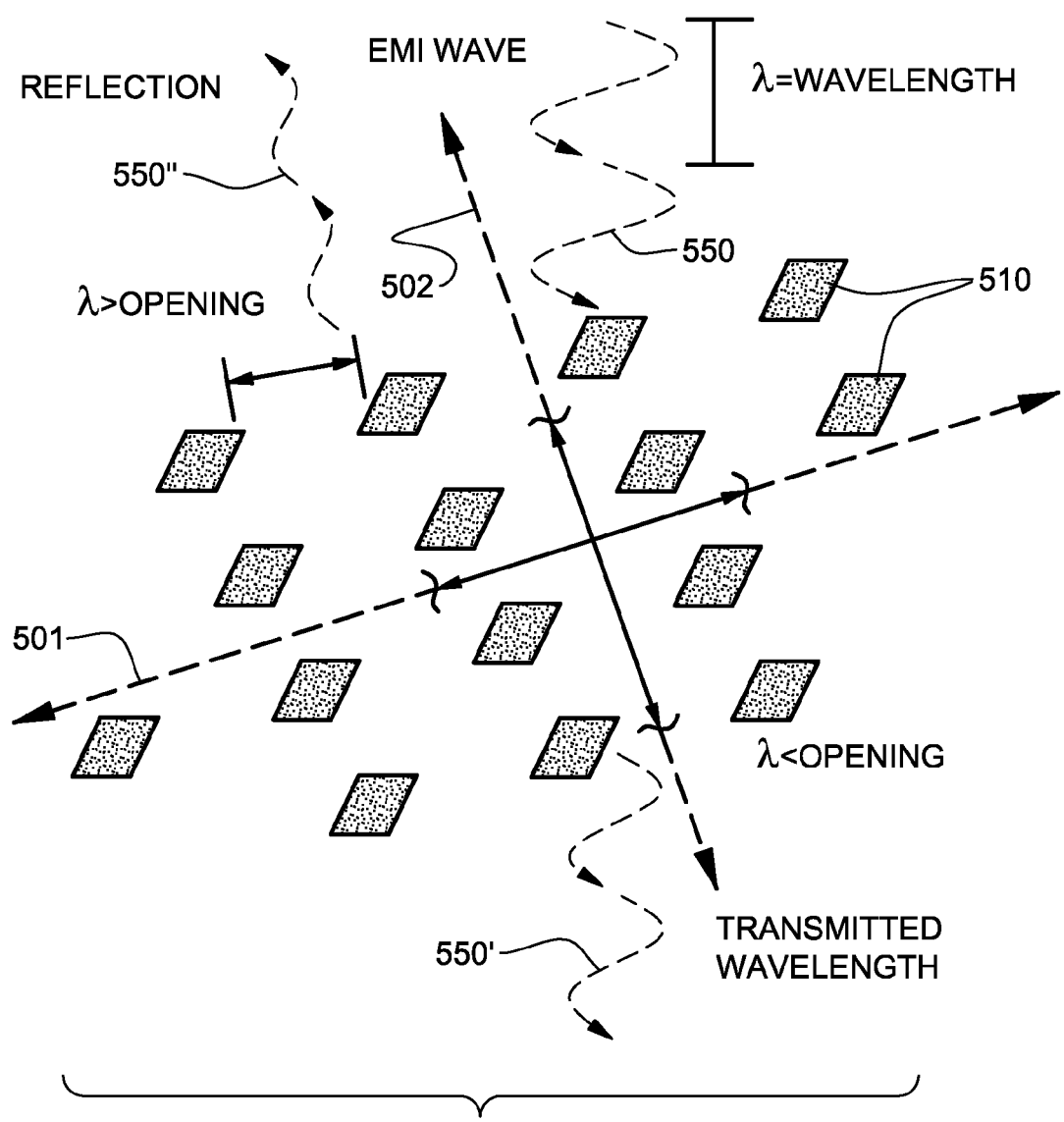
FIG. 5 is a representation of one BEOL layer having an array of conductive fill structures extending in a first direction and a second direction, which is useful in explaining aspects of the present invention.

FIG. 5 illustrates one partial embodiment of a BEOL layer having an arrayed pattern of CMP fill structures 510 similar to the structures of FIG. 4. In the example of FIG. 5, an EMI wave 550 having a wavelength λ is shown impinging on the BEOL dielectric layer. In spaces between CMP fill structures 510 where the dielectric material opening is larger than wavelength λ (that is, along the first direction 501 or second direction 502), the EMI wave 550' passes through the BEOL layer, while in those spaces where the wavelength λ is larger than the dielectric material opening between CMP fill structures, the EMI wave 550" is reflected. Advantageously, this property is employed herein in modifying one or more BEOL layers to enhance EMI reflectivity in one or both arrayed directions of fill structures of the one or more BEOL layers. In one embodiment, multiple BEOL layers are employed for enhanced filtering of electromagnetic interference, for example, using polarization.

Figure 6:
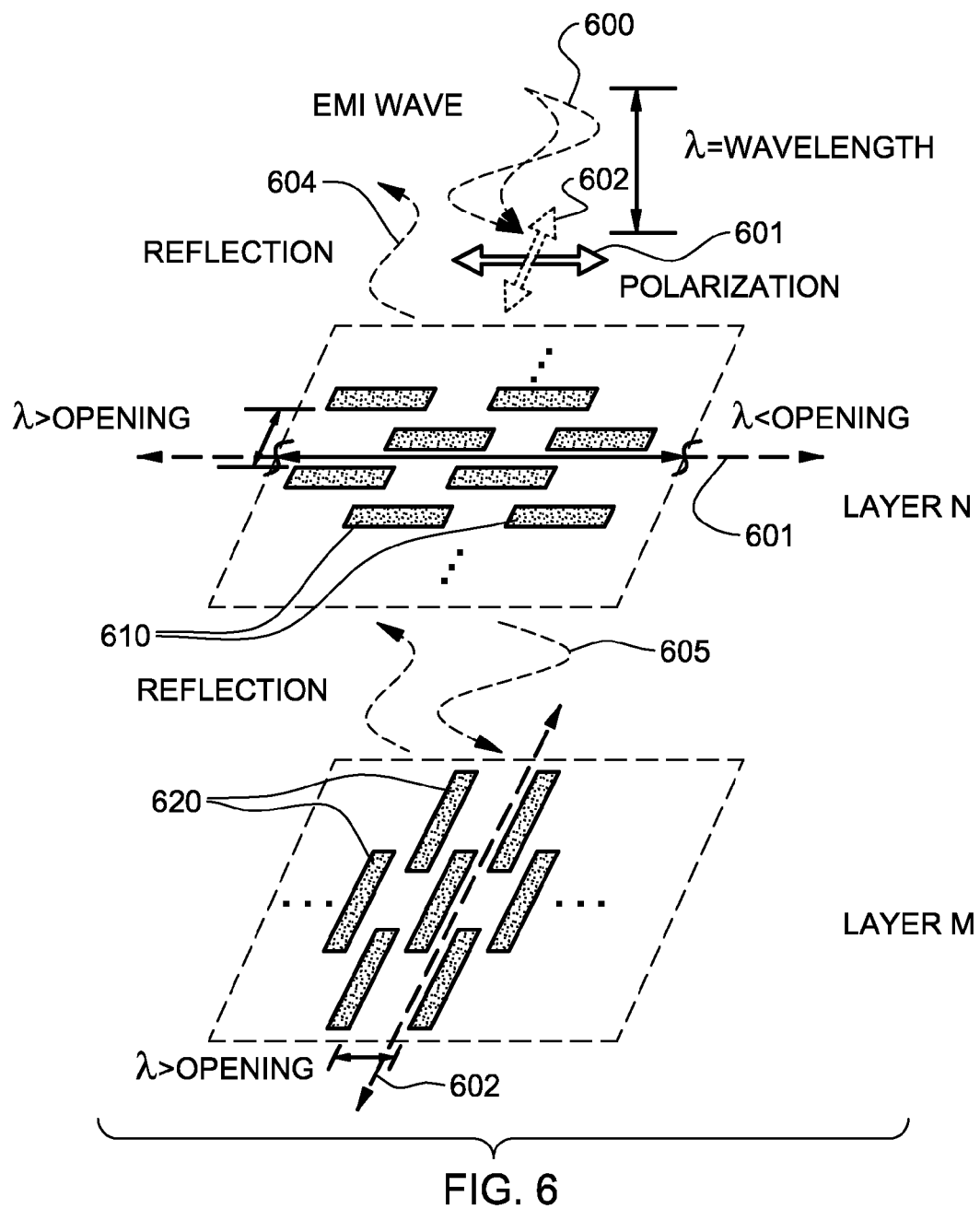
FIG. 6 is a representation of portions of two BEOL layers of a circuit structure, wherein each BEOL layer is configured to block electromagnetic interference of a particular wavelength from passing therethrough in at least one of a first direction or a second direction, and wherein the lower BEOL layer blocks polarized electromagnetic interference passing through the upper BEOL layer, in accordance with an aspect of the present invention.

FIG. 6 depicts one example of this polarization concept wherein conductive patterns for two BEOL layers M, N are partially illustrated. Layers M, N may, in one embodiment, be any two layers of a plurality of BEOL layers of a circuit structure. Alternatively, layers M, N may be adjacent BEOL dielectric layers, which are separated by a single BEOL interconnect metallization layer (not shown). In one specific example, layer N is an upper BEOL layer which has a plurality of discrete, conductive fill structures 610 configured with a shape, size, spacing and orientation designed to polarize external electromagnetic interference 600 impinging thereon in a first direction 601. More particularly, the plurality of discrete, conductive fill structures 610 illustrated in FIG. 6 are a plurality of elements arrayed in first direction 601 and second direction 602. As shown, the plurality of elements of the conductive pattern are sized and positioned in the second direction to block electromagnetic interference of a particular wavelength from passing therethough. That is, in the second direction 602, the electromagnetic wavelength will typically be greater than the opening space between adjacent conductive fills structures 610, thereby blocking (i.e., reflecting) 604 the electromagnetic interference. As shown, the electromagnetic interference wavelength is less than the opening space in the first direction 601, and therefore, electromagnetic interference 605 in this direction is allowed to pass through layer N, thus polarizing the electromagnetic interference.

The polarized electromagnetic interference 605 passing through layer N subsequently impinges upon layer M, where a plurality of discrete, conductive fill structures 620 are again encountered, this time with an orientation substantially orthogonal to the orientation of conductive fill structures 610 of layer N. More particularly, in layer N, the plurality of elements are again arrayed in first direction 601 and second direction 602 (by way of example only) and the elements are sized and positioned to block electromagnetic interference in the first direction. This is achieved by limiting the spacing between conductive fill structures 620 in the first direction as illustrated. Thus, the impinging polarized electromagnetic interference 605 in the first direction is blocked (e.g., reflected) by the conductive fill structures 620 of layer M.

Figure 7:
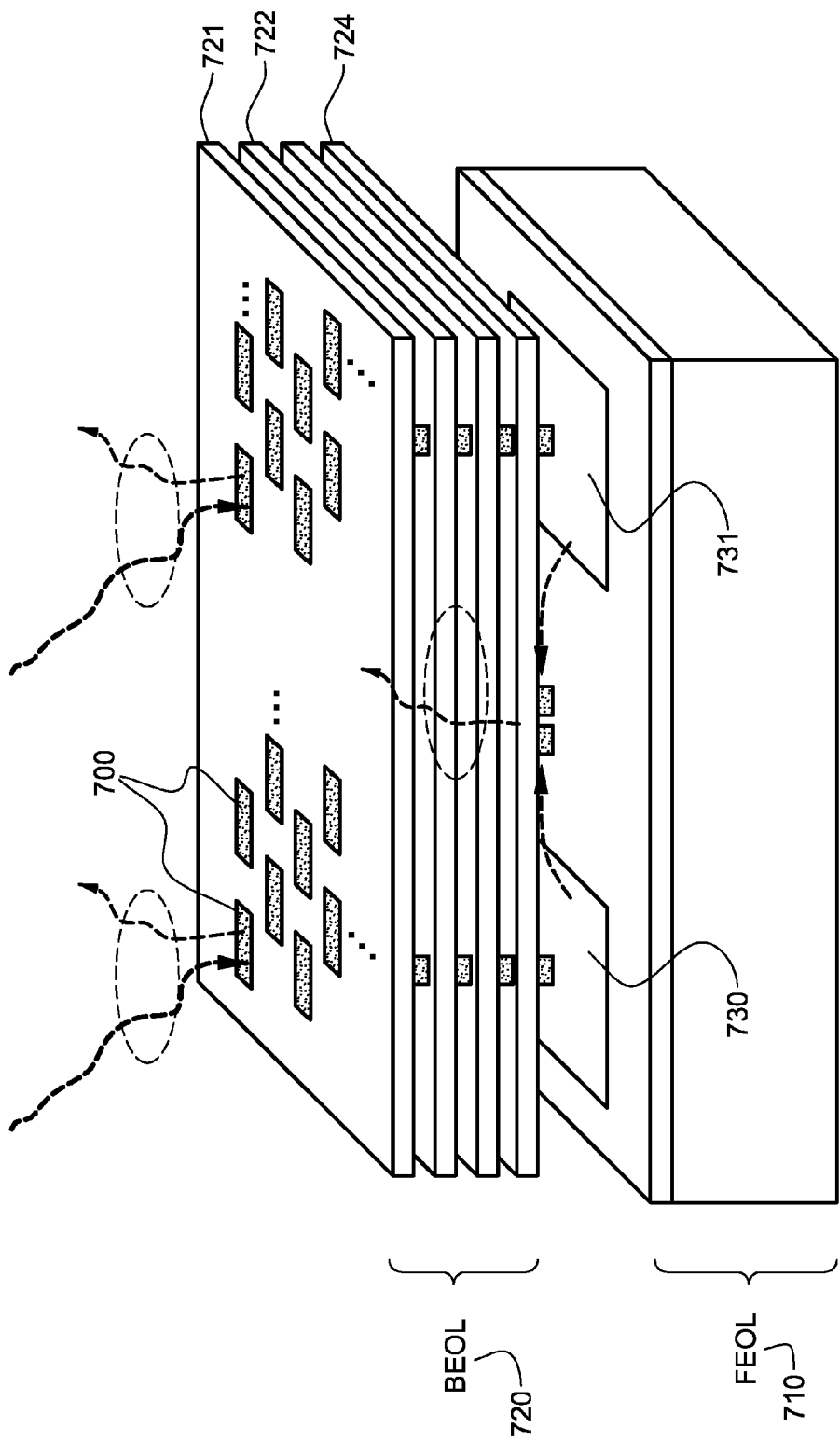
FIG. 7 is an isometric view of one embodiment of a circuit structure having multiple BEOL layers configured as illustrated in FIG. 6, in accordance with an aspect of the present invention.

FIG. 7 illustrates one circuit structure example employing a plurality of conductive patterns 700 arrayed throughout portions of at least the uppermost and lowermost BEOL layers of the plurality of BEOL layers 720 disposed above the active circuits in the FEOL layers 710. In this example, the conductive fill structures depicted in FIG. 6 are employed, with the plurality of conductive patterns 700 differently arrayed in a first direction and a second direction throughout multiple BEOL layers 720. For example, an upper BEOL layer 721 is shown with a conductive pattern similar to the conductive pattern of layer N in FIG. 6, and BEOL layer 722 is assumed to have a conductive pattern similar to the conductive pattern of layer M in FIG. 6. In this way, external electromagnetic interference is substantially blocked by the BEOL layers 721, 722. For further enhanced electromagnetic interference shielding, additional BEOL layers of the plurality of BEOL layers may be modified with other conductive patterns and orientations to provide enhanced electromagnetic interference shielding. In one embodiment, most, if not all, of the BEOL layers are modified at least partially with conductive patterns configured as proposed herein to further shield against external electromagnetic interference and internal electromagnetic interference.

In the example of FIG. 7, internal electromagnetic interference shielding is shown via a BEOL dielectric layer 724, which again includes a conductive pattern as presented herein, configured to block electromagnetic interference of a particular wavelength from passing therethrough in a direction along an axis passing through circuit portions 730, 731. This facilitates EMI shielding of noise generated by one circuit portion 730, 731 from impacting another circuit portion 730, 731.

Figure 8:
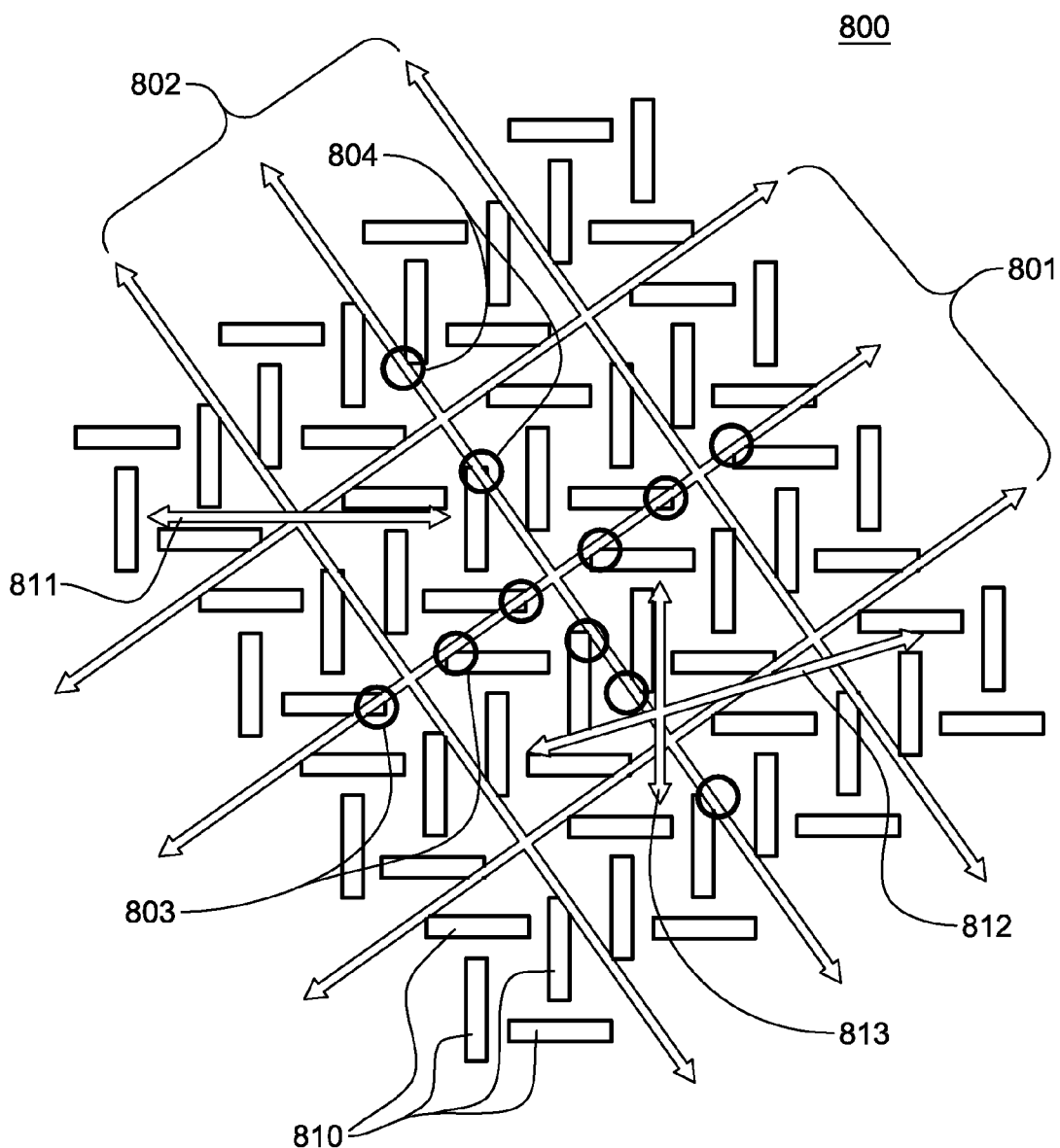
FIG. 8 is a representation of an alternate embodiment of a single BEOL layer comprising a plurality of elements arrayed in a first direction and a second direction, and sized and positioned in both the first direction and the second direction to block electromagnetic interference of particular wavelength from passing therethrough, in accordance with an aspect of the present invention.

FIG. 8 is a plan view of an alternate embodiment of a BEOL dielectric layer with a conductive pattern configured in accordance with an aspect of the present invention. In this embodiment, the conductive pattern 800 again includes a plurality of elements 810 which are arrayed in a first direction 801 and a second direction 802. The plurality of elements 810 of conductive pattern 800 are sized and positioned in both the first direction and the second direction to block electromagnetic interference of a particular wavelength from passing therethrough. More particularly, in the first direction 801, the plurality of elements 810 are shown overlapping 803, thereby limiting electromagnetic interference from passing therethrough in the first direction. Similarly, the plurality of elements 810 are sized and positioned in the second direction 802 to overlap 804 and thereby prevent electromagnetic interference of particular wavelength from passing therethrough in the second direction. As illustrated, the maximum spacing 811, 812, 813 between elements 810 can be selected or designed to block electromagnetic interference above a particular wavelength from passing therethrough. The conductive pattern of the BEOL dielectric layer illustrated in FIG. 8 provides one example of a single BEOL layer configured to block electromagnetic interference of particular wavelength in any direction from passing therethrough. The particular wavelength allowed to pass through the conductive pattern would depend, for example, on the longest dielectric spacing 812 between elements 810.

Figure 9:
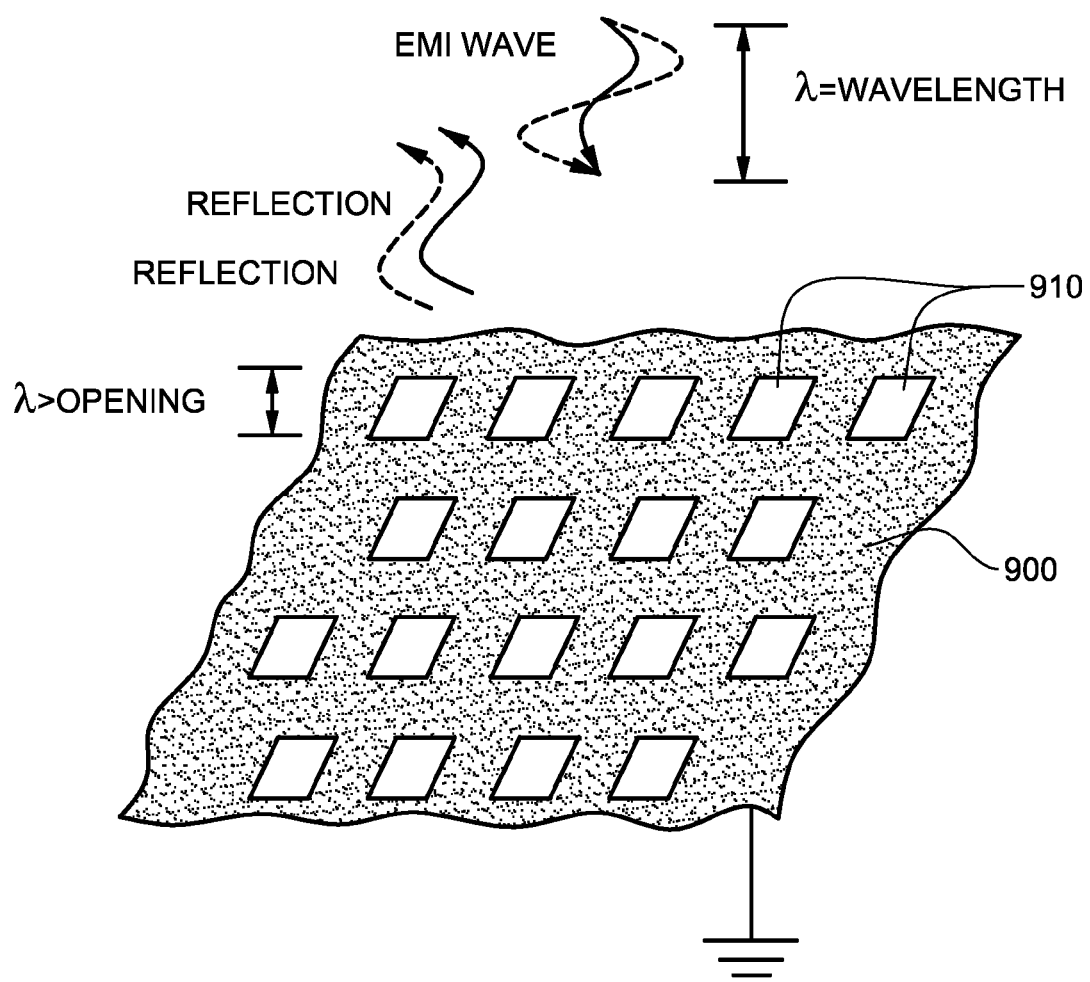
FIG. 9 is a representation of an alternate embodiment of a BEOL layer for a circuit structure, such as depicted in FIGS. 1 & 7, comprising a grounded, conductive mesh structure for blocking electromagnetic interference, in accordance with an aspect of the present invention.

FIG. 9 depicts an alternate embodiment of a BEOL layer, in accordance with an aspect of the present invention. In this embodiment, the BEOL layer is substantially a conductive (e.g., metal) layer 900 which has a plurality of rectangular-shaped, dielectric filled openings 910 arrayed therethrough. The dielectric filled openings 910 are selected to be smaller than the wavelength λ of the electromagnetic interference wave to be blocked, but of sufficient quantity and size to meet the relevant CMP ratio. This function is attained by appropriately selecting the shape, size, spacing and orientation of openings 910. In this example, the conductive layer is grounded to further enhance shielding performance. As one example, the conductive layer of FIG. 9 may be viewed as a grounded, conductive mesh structure that is inserted as one of the BEOL layers.

Advantageously, those skilled in the art will note from the above discussion that presented herein is a novel approach to employing chemical-mechanical polishing fill patterns for achieving electromagnetic interference shielding. The electromagnetic interference shielding achieved is adjustable by controlling the cutoff EMI wavelength which is allowed to pass through a given BEOL layer, for example, by appropriately adjusting the shape, size, spacing or orientation characteristics of the conductive patterns, or more particularly, of the conductive fill structures in the pattern or the openings in a conductive mesh structure. Multiple BEOL layers may be employed with different fill/opening patterns and different filter orientations in order to achieve a desired level of electromagnetic interference shielding.

Advantageously, the concepts presented herein are implementable without any technology process change to traditional semiconductor integrated circuit fabrication. The conductive patterns employed are further selected to be BEOL chemical-mechanical polishing ratio compliant. Thus, electromagnetic interference shielding is achieved within existing design rules, and integrated circuit chip manufacturability is enhanced.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A circuit structure comprising:
   at least one substrate comprising at least one integrated circuit;
   a plurality of back end of line (BEOL) layers disposed over the at least one substrate, a first BEOL layer of the plurality of BEOL layers comprising a first conductive pattern defined therein by a first plurality of separate conductive elements arrayed in a first direction and a second direction throughout at least a portion thereof, the conductive elements of the first plurality of separate conductive elements being electrically isolated from each other within the first BEOL layer, and a second BEOL layer of the plurality of BEOL layers comprises a second conductive pattern defined therein by a second plurality of separate conductive elements arrayed in the first direction and the second direction throughout at least a portion thereof, the conductive elements of the second plurality of separate conductive elements being electrically isolated from each other within the second BEOL layer, and the second BEOL layer being disposed between the first BEOL layer and the at least one substrate, and wherein the first conductive pattern is configured to polarize electromagnetic interference in one of the first direction or the second direction, and the second conductive pattern is configured to block polarized electromagnetic interference in the other of the first direction or second direction from passing therethrough, and wherein the first BEOL layer and second BEOL layer cooperate to block external electromagnetic interference of a particular wavelength in any direction from passing therethrough to the at least one substrate; and
   wherein the first BEOL layer is a first BEOL dielectric layer, the first conductive pattern being a first conductive chemical-mechanical polishing (CMP) fill pattern configured in part relative to the size of the first BEOL dielectric layer to satisfy a predefined chemical-mechanical polishing ratio for the first BEOL dielectric layer, the predefined chemical-mechanical polishing ratio for the first BEOL dielectric layer being a predefined area-occupation ratio of dielectric material of the first BEOL dielectric layer to conductive material of the first conductive CMP fill pattern, and the second BEOL layer is a second BEOL dielectric layer, the second conductive pattern being a second conductive CMP fill pattern configured in part relative to the size of the second BEOL dielectric layer to satisfy a predefined chemical-mechanical polishing ratio for the second BEOL dielectric layer, the predefined chemical-mechanical polishing ratio for the second BEOL dielectric layer being a predefined area-occupation ratio of dielectric material of the second BEOL dielectric layer to conductive material of the second conductive CMP fill pattern.

2. The circuit structure of claim 1, wherein the first conductive CMP fill pattern of the first BEOL dielectric layer is oriented in a different direction than the second conductive CMP fill pattern of the second BEOL dielectric layer.

3. The circuit structure of claim 1, wherein the plurality of separate conductive elements of the first conductive pattern are configured and positioned to block the electromagnetic interference of particular wavelength in the first direction from passing therethrough, polarizing the electromagnetic interference in the second direction, and the plurality of elements of the second conductive pattern are configured and positioned to block the polarized electromagnetic interference of particular wavelength in the second direction from passing therethrough to the at least one substrate.

4. The circuit structure of claim 1, wherein the separate conductive elements of the first conductive CMP fill pattern are rectangular-shaped and extend in a first direction, and the separate conductive elements of the second conductive CMP fill pattern are rectangular-shaped and extend in a second direction, wherein the first direction and the second direction are different directions.

5. The circuit structure of claim 4, wherein the separate conductive elements of the first conductive CMP fill pattern and the separate conductive elements of the second conductive CMP fill pattern are homogeneously sized and shaped, and wherein the first direction is perpendicular to the second direction.

6. A circuit structure comprising:
   at least one semiconductor substrate comprising at least one integrated circuit;
   a plurality of back end of line (BEOL) layers disposed over the at least one semiconductor substrate, the plurality of BEOL layers comprising a plurality of BEOL dielectric layers interleaved with a plurality of BEOL interconnect metallization layers for electrically connecting to the at least one integrated circuit, a first BEOL dielectric layer of the plurality of BEOL dielectric layers comprising a first conductive pattern defined therein by a first plurality of separate conductive elements arrayed in a first direction and a second direction throughout at least a portion thereof, the conductive elements of the first plurality of separate conductive elements being electrically isolated from each other within the first BEOL dielectric layer, and a second BEOL dielectric layer of the plurality of BEOL dielectric layers comprises a second conductive pattern defined therein by a second plurality of separate conductive elements arrayed in the first direction and the second direction throughout at least a portion thereof, the conductive elements of the second plurality of separate conductive elements being electrically isolated from each other within the second BEOL dielectric layer, and the second BEOL dielectric layer being disposed between the first BEOL dielectric layer and the at least one substrate, and wherein the first conductive pattern is configured to polarize electromagnetic interference in one of the first direction or the second direction, and the second conductive pattern is configured to block polarized electromagnetic interference in the other of the first direction or second direction from passing therethrough, and wherein the first BEOL dielectric layer and second BEOL dielectric layer cooperate to block external electromagnetic interference of a particular wavelength in any direction from passing therethrough to the at least one substrate; and wherein the first conductive pattern is a first conductive chemical-mechanical polishing (CMP) fill pattern configured in part relative to the size of the first BEOL dielectric layer to satisfy a predefined chemical-mechanical polishing ratio for the first BEOL dielectric layer, the predefined chemical-mechanical polishing ratio for the first BEOL dielectric layer being a predefined area-occupation ratio of dielectric material of the first BEOL dielectric layer to conductive material of the first conductive CMP fill pattern, and the second conductive pattern is a second conductive CMP fill pattern configured in part relative to the size of the second BEOL dielectric layer to satisfy a predefined chemical-mechanical polishing ratio for the second BEOL dielectric layer, the predefined chemical-mechanical polishing ratio for the second BEOL dielectric layer being a predefined area-occupation ratio of dielectric material of the second BEOL dielectric layer to conductive material of the second conductive CMP fill pattern.

7. The circuit structure of claim 6, wherein the first conductive CMP fill pattern of the first BEOL dielectric layer is oriented in a different direction than the second conductive CMP fill pattern of the second BEOL dielectric layer.

8. The circuit structure of claim 7, wherein the separate conductive structures of the, first conductive CMP fill pattern are similarly shaped and sized to the separate conductive structures of the second conductive CMP fill pattern.

9. The circuit structure of claim 7, wherein the separate conductive elements of the first conductive CMP fill pattern are rectangular-shaped and extend in a first direction, and the separate conductive elements of the second conductive CMP fill pattern are rectangular-shaped and extend in a second direction, wherein the first direction and the second direction are different directions.

10. A method of fabricating a circuit structure comprising:
providing at least one semiconductor substrate comprising at least one integrated circuit; and
forming a plurality of back end of line (BEOL) layers over the at least one semiconductor substrate, wherein the plurality of BEOL layers comprise multiple BEOL dielectric layers and at least one BEOL interconnect metallization layer, the multiple BEOL dielectric layers comprising:
a first BEOL dielectric layer comprising a first conductive pattern defined therein by a first plurality of separate conductive elements arrayed in a first direction and a second direction throughout at least a portion thereof, the conductive elements of the first plurality of separate conductive elements being electrically isolated from each other within the first BEOL dielectric layer, and a second BEOL dielectric layer comprising a second conductive pattern defined therein by a second plurality of separate conductive elements arrayed in the first direction and the second direction throughout at least a portion thereof, the conductive elements of the second plurality of separate conductive elements being electrically isolated from each other within the second BEOL dielectric layer, and the second BEOL dielectric layer being disposed between the first BEOL dielectric layer and the at least one substrate, and wherein the first conductive pattern is configured to polarize electromagnetic interference in one of the first direction or the second direction, and the second conductive pattern is configured to block polarized electromagnetic interference in the other of the first direction or second direction from passing therethrough, and wherein the first BEOL dielectric layer and second BEOL dielectric layer cooperate to block external electromagnetic interference of a particular wavelength in any direction from passing therethrough to the at least one substrate; and wherein the first conductive pattern is a first conductive chemical-mechanical polishing (CMP) fill pattern configured in part relative to the size of the first BEOL dielectric layer to satisfy a predefined chemical-mechanical polishing ratio for the first BEOL dielectric layer, the predefined chemical-mechanical polishing ratio for the first BEOL dielectric layer being a predefined area-occupation ratio of dielectric material of the first BEOL dielectric layer to conductive material of the first conductive CMP fill pattern, and the second conductive pattern is a second conductive CMP fill pattern configured in part relative to the size of the second BEOL dielectric layer to satisfy a predefined chemical-mechanical polishing ratio for the second BEOL dielectric layer, the predefined chemical-mechanical polishing ratio for the second BEOL dielectric layer being a predefined area-occupation ratio of dielectric material of the second BEOL dielectric layer to conductive material of the second conductive CMP fill pattern.

11. The method of claim 10, wherein the first conductive CMP fill pattern of the first BEOL dielectric layer is oriented in a different direction than the second conductive CMP fill pattern of the second BEOL dielectric layer.

12. The method of claim 11, wherein the separate conductive elements of the first conductive CMP fill pattern are rectangular-shaped and extend in a first direction, and the separate conductive elements of the second conductive CMP fill pattern are rectangular-shaped and extend in a second direction, wherein the first direction and the second direction are perpendicular directions.

* * * * *